United States Patent [19]

Lesea

[11] Patent Number: 4,947,382

[45] Date of Patent: Aug. 7, 1990

[54] DIRECT DIGITAL LOCKED LOOP

[75] Inventor: Austin H. Lesea, San Jose, Calif.

[73] Assignee: Vista Labs, Inc., San Jose, Calif.

[21] Appl. No.: 336,238

[22] Filed: Apr. 11, 1989

[51] Int. Cl.[5] .......... G04F 8/00; H03L 7/00

[52] U.S. Cl. .......... 368/118; 368/156; 331/1 A; 331/25

[58] Field of Search .......... 368/113, 118-121, 368/155-156; 331/1 A, 2, 17, 18, 25; 375/110, 118-120

[56] References Cited

U.S. PATENT DOCUMENTS

| | | | |
|---|---|---|---|
| 3,675,146 | 7/1972 | Langham | 331/25 |
| 4,305,045 | 12/1981 | Metz et al. | 331/25 |
| 4,354,164 | 10/1982 | Gupta | 331/25 |
| 4,521,744 | 6/1985 | Yamada et al. | 331/25 |
| 4,538,119 | 8/1985 | Ashida | 331/1 A |
| 4,563,657 | 7/1986 | Qureshi et al. | 331/25 |
| 4,598,257 | 7/1986 | Southard | 331/2 |
| 4,743,857 | 5/1988 | Childers | 331/25 |

*Primary Examiner*—Vit W. Miska

*Attorney, Agent, or Firm*—Blakely, Sokoloff, Taylor & Zafman

[57] ABSTRACT

A digital locked loop which can act as a slave clock. The digital loop is able to monitor a master clock signal and adjust its own output to accurately track the frequency of the master clock signal. In addition, the digital loop can generate a highly accurate timing signal in the absence of the master clock. An oscillator supplies a signal having a fixed frequency to a digital synthesizer. The synthesizer treats the oscillator frequency as a known standard. The synthesizer uses that standard to generate an output signal with a different frequency. The frequency of the output signal is chosen so that it is equal to a frequency supplied by an external master clock. The present invention utilizes a digital feedback loop to detect any phase shift between the output signal and the master clock signal. The presence of any phase shift indicates that the frequency of the master clock signal has changed. A microprocessor measures the amount of this phase shift and adjusts the output of the digital synthesizer to equal the new frequency of the master clock signal.

18 Claims, 2 Drawing Sheets

DIRECT DIGITAL LOCKED LOOP

BACKGROUND OF THE INVENTION

1. FIELD OF THE INVENTION:

The present invention relates to the field of timing systems, and more particularly to a digital timing loop for slave clock systems.

2. ART BACKGROUND:

Many large electronic systems require extremely accurate clock signals to operate correctly. In order to generate these extremely accurate clock signals, a very stable oscillator such as a cesium or hydrogen maser is typically used. These masers provide clock signals that are accurate within the range of 1 part in $10^{13}$ to 1 part in $10^{14}$.

In large systems, there are often several clocks to provide the necessary timing signals. These clocks may be dispersed over large distances and connected together in a network. One of the clocks in the network typically acts as a master unit and the remaining clocks are slave units. While the slaves are connected to the master, they closely track the output master clock signal to insure that all parts of the system are synchronized. Should the master clock fail, however, the slave clocks must be able to generate highly accurate timing signals of their own, and their circuits must rely on the slave clock signals until the master clock is restored.

In prior art devices, slave clocks were comprised of analog oscillators. The output frequency was adjusted by providing an error voltage to the oscillator. However, these analog oscillators are not highly accurate when compared to an atomic reference clock. In order to generate a clock signal that is accurate to 1 part in $10^{14}$, the error voltage must be equally as accurate. Prior art technology was simply unable to achieve this high degree of precision.

Another disadvantage of the prior art is the speed in which the frequency of the slave clock may be changed. Analog devices must be designed to respond either quickly (within milliseconds) or slowly (within seconds) to an error signal. Thus, the prior art devices were not able to adapt or change the response time to account for changes in the application of the clock system. If the response time is too fast, transient events will introduce errors in timing. If the response time is too slow the clock system may take too long to stabilize after acquiring the master clock reference frequency.

SUMMARY OF THE INVENTION

The present invention overcomes the previously described limitations by providing a digital locked loop which can act as a slave clock. The digital loop is able to monitor a master clock signal and adjust its own output to accurately track the frequency of the master clock signal. In addition, the digital loop can generate a highly accurate timing signal in the absence of the master clock. An oscillator supplies a fixed frequency signal to a digital synthesizer. The synthesizer treats the oscillator frequency as a known standard. The synthesizer uses that standard to generate a output signal with a different frequency. The frequency of the output signal is chosen so that it is equal to a frequency supplied by an external master clock. The present invention utilizes a digital feedback loop to detect any phase shift between the output signal and the master clock signal. The presence of any phase shift indicates that the frequency of the master clock signal has changed or the slave clock reference has changed. A microprocessor measures the amount of this phase shift and adjusts the output of the digital synthesizer to equal the new frequency of the master clock signal. The feedback loop comprises two counters which count the number of pulses in each signal during the same amount of time. So long as these two numbers are equal, the two signals have the same frequency. If, however, the counters record a different number of pulses, then the frequency of the master clock has changed, and the output signal must be adjusted accordingly. The microprocessor reads the contents of the counters to measure any relative change in phase shift and make any necessary adjustments to the output signal.

DETAILED DESCRIPTION OF THE INVENTION

A direct digital locked loop having particular application in a timing system utilizing master and slave clock units is described. In the following description, for purposes of explanation, specific bit arrangements, counter sizes, and timing details are set forth in order to provide a thorough understanding of the present invention. In other instances, components such as microprocessors and digital frequency synthesizers are not described in detail, or are shown in block diagram form so as not to obscure the present invention unnecessarily. Moreover, throughout the following description, reference is made to a master clock which supplies a reference clock frequency to the digital loop of the present invention. It is to be understood that the master clock is not an element of the present invention; its description is given to provide a better understanding of the present invention. The invention consists of the apparatus and method used to implement the digital loop.

Figure 1:
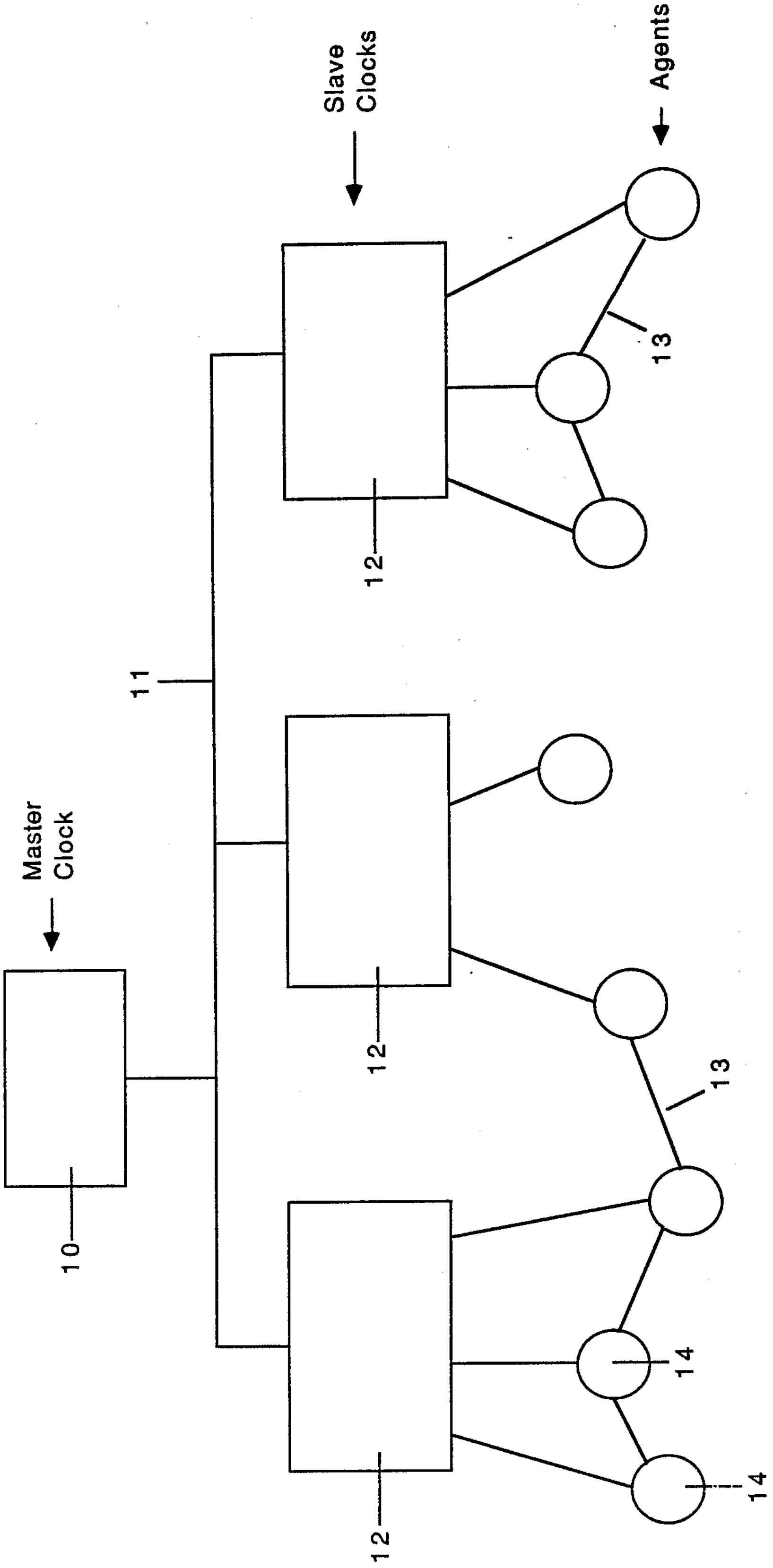
FIG. 1 illustrates an electronic system using master and slave clocks.

Referring first to FIG. 1, a block diagram of an electronic system using master clock unit 10 and slave clock units 12 is shown. In the system illustrated, various electronic devices, denoted generally as agents 14, are electrically connected together via network lines 13. The agents 14 require accurate clock signals for proper operation. Moreover, all of the agents in the system operate synchronously and require the master and slave clock signals to be synchronized. Instead of providing separate and isolated clocks for various portions of the system, however, the slave clocks 12 are connected to the master clock 10 by the clock signal lines 11. The slave clocks monitor the frequency of the master clock 10 and adjust their own outputs to track the master clock. In this manner, all of the clocks are providing the same timing signals to the agents 14. Circumstances may occur when one of the clock signal lines 11 is broken and a slave clock becomes isolated. In this event, the isolated slave clock must generate its own accurate timing signals for use by the agents 14 to which it is connected. The digital locked loop of the present invention can operate as a slave clock 12 as described above. It contains a mechanism for adjusting its own output to track the output of the master clock. The digital loop can also generate highly accurate timing signals in the absence of a master clock signal.

Figure 2:
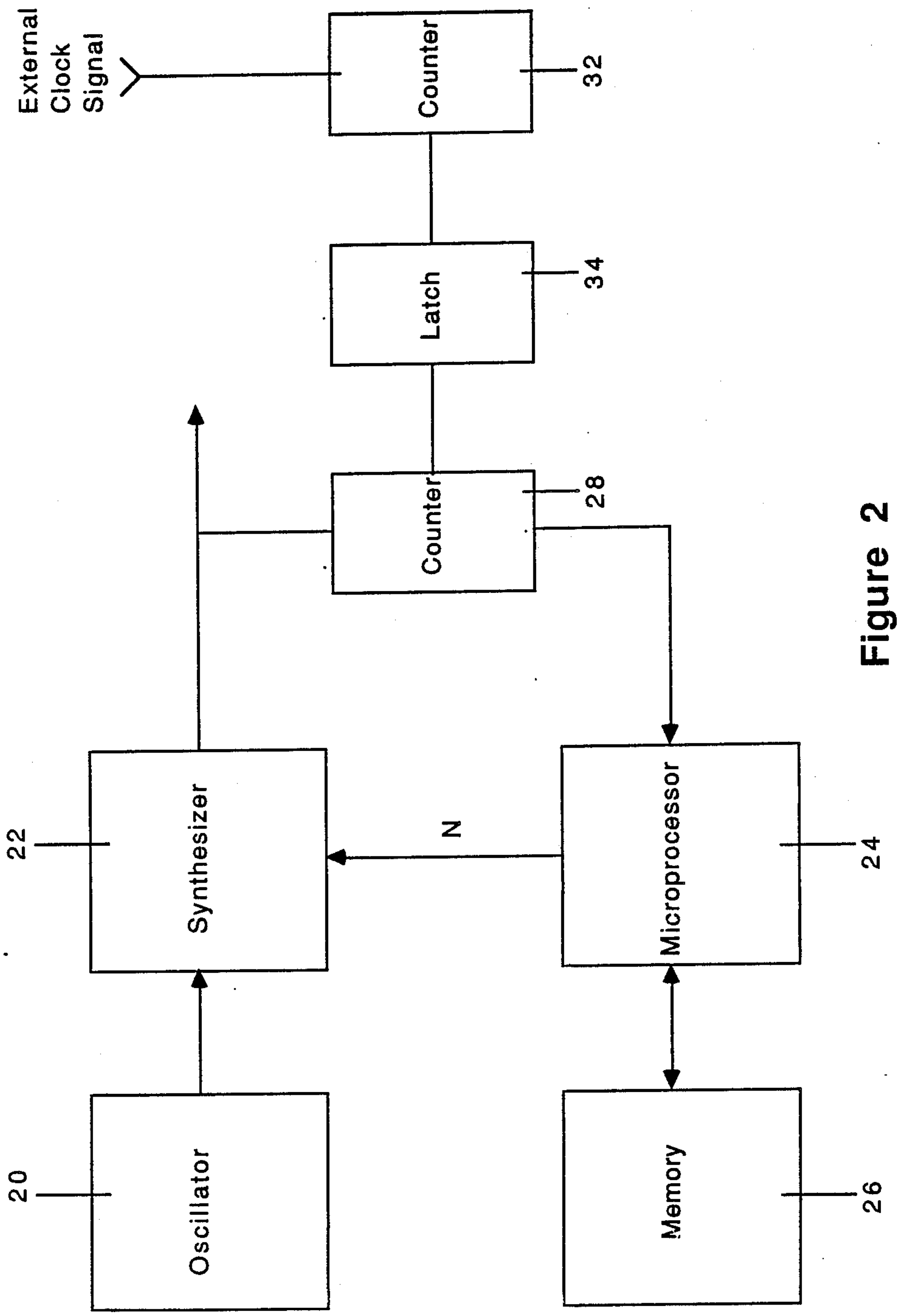
FIG. 2 shows, in block diagram form, the digital loop of the present invention.

Referring next to FIG. 2, a block diagram of the components which comprise the digital locked loop of the present invention is shown. An oscillator 20 generates a timing signal at a fixed frequency. A non-adjustable oscillator is preferred because that type of oscillator will generally provide an output signal that is highly accurate and does not vary over time. The oscillator 20 may be one of a variety of commercially available devices. All oscillators are sensitive to variations in environmental factors, such as temperature. The output frequency of the oscillator will shift as outside environmental factors change. Therefore, in the preferred embodiment, the oscillator is kept within an oven and is heated to a predetermined, constant temperature. In the present embodiment, the oscillator 20 generates a signal at 10.24 MHz. It will be apparent to those skilled in the art, however, that the oscillator may be chosen so as to generate an output signal of a different frequency. Throughout this Specification, the frequency of the oscillator signal will be generally referred to as $F_{osc}$.

The oscillator 20 is coupled to the digital frequency synthesizer 22. This synthesizer may be one of a number of commercially available devices, such as those manufactured by Logic Devices, Incorporated. The oscillator frequency acts as a reference for the digital synthesizer 22. The synthesizer operates on the presumption that Fosc is kept fixed with a high degree of precision, such as within one part in $10^{-11}$ to $10^{-13}$. The frequency synthesizer uses a digital process to convert the signal from the oscillator into a signal having a second, related frequency. The synthesizer 22 accomplishes this conversion by utilizing a stored algorithm and a numerical input from the microprocessor 24. The exact methods employed by the synthesizer 22 are well known to those skilled in the art, and will not be discussed here. In general, however, the synthesizer 22 counts the pulses generated by the oscillator 20. The synthesizer then uses an arithmetic process to generate the new frequency based on the oscillator standard. Since the synthesizer uses only the frequency $F_{osc}$ as a reference, and does not directly modify this signal, the synthesizer can generate a plurality of desired output signals which are as accurate as the original oscillator signal.

In the preferred embodiment, the synthesizer 22 accepts an integer, N, from the microprocessor 24. The synthesizer then generates a new output frequency ($F_{out}$) from $F_{osc}$ according to the following formula:

$$F_{out} = \frac{(N)(F_{osc})}{2^X}$$

where X is the number of binary digits (bits) used by the synthesizer 22.

It will be readily apparent to those skilled in the art that the preferred conversion formula is only one of a large number of such formulas that may be employed. Different conversion formulas can be realized by changing the particular synthesizer chip used. As noted above, the synthesizer uses the oscillator signal as a reference value. Thus, in this case, the final quality of the output frequency will be directly dependent on the stability of the signal generated by the oscillator. For this reason, the oscillator in the preferred embodiment is chosen to be non-adjustable, since a highly accurate output frequency is desired. An oscillator which runs at a fixed frequency can generally be made more stable than an adjustable oscillator which may be set to output one of a plurality of frequencies. Another advantage of the fixed frequency oscillator is that it does not require any manual adjustments or monitoring. Accordingly, all sources of human error are removed from the oscillator signal and from $F_{osc}$.

Since one object of the invention is to provide a method of tracking an external clock frequency, the synthesizer generates $F_{out}$ such that $F_{out}$ is as close as possible to the frequency supplied by the master clock 10. The synthesizer signal is output over clock output line 30. The microprocessor 24 supplies the correct integer N to the synthesizer 22 to insure that the correct output signal is generated. The exact method in which the microprocessor 24 selects N will be described below.

The digital loop then compares $F_{out}$ with the frequency of the signal supplied by the master clock 10 ($F_{master}$) over the master clock line 30. A feedback circuit is employed to change $F_{out}$ in response to any variations in $F_{master}$. Changes may be made quickly (seconds) or slowly (tens to hundreds of seconds) depending on the application.

As illustrated in FIG. 2, the incoming master clock signal is coupled to counter 32. Counter 32 counts each incoming pulse in the master clock signal. At the same time, the synthesizer output signal is coupled to counter 28, which simultaneously counts each pulse of the synthesizer signal. When the master clock counter 32 reaches its maximum value, it generates an overflow signal which is coupled to latch 34. Upon receiving this overflow signal, the latch reads the correct value of the output signal counter 28 and transmits that value to the microprocessor 24. The master clock counter 32 then resets to zero and the entire procedure repeats itself.

Depending on the values chosen for the counters, it is possible to determine whether the two signals are in phase and, hence, if they are equal in frequency. In the preferred embodiment, the counters are chosen so that they both store the same maximum values, namely $2^{16}$.

If the two signals are in phase, then the number in counter 28 which is periodically supplied to the microprocessor 24 will remain constant. This is best illustrated by an example. At some arbitrary point in time, the master clock counter 32 will be reset to zero. At this same time, the output counter will contain some value, which will be designated M. After counter 32 counts a number of input pulses equal to the maximum value of the counter (which in the preferred embodiment is $2^{16}$) it will generate an overflow signal, as described above. As soon as the latch receives the overflow signal, it causes counter 28 to latch its value to the microprocessor 24. If counter 28 stores the same value as counter 32, and if $F_{out}$ equals $F_{master}$, then it is easily seen that the value in counter 28 will again be equal to M when latch 34 is clocked upon the receipt of the overflow signal. So long as their is no phase shift between the output signal and the master clock signal, the microprocessor 24 will read a continuous stream of the same values from counter 28. In this example, that value will be M.

Assume, however, that the master clock signal does not remain constant and, instead, varies in frequency over time. Then the phase difference between output signal and the master clock signal will shift. Because $F_{out}$ will not always equal $F_{master}$, this phase shift can be easily measured using counters 28 and 32.

As before, assume that at an arbitrary point in time, counter 32 is set to zero and counter 28 contains some value M. Again, the overflow signal from counter 32 will periodically latch the contents of counter 28 and transfer that value to the microprocessor 24. Unlike the prior example, however, the value in counter 28 will not be the same each time it is latched. Since the output and master clock frequencies do not have the same value, the two counters will count a different number of pulses during the same amount of time. Thus, each time counter 28 is latched, it will transfer a different value to the microprocessor. The microprocessor 24 contains a set of instructions which allow it to analyze the values in counter 28 to determine the new frequency of the master clock signal. The microprocessor 24 then uses data stored in non-volatile memory 26 to determine a new value of N to be output to the digital synthesizer. As discussed above, the digital synthesizer 22 uses N to synthesize a signal which is equal to the master clock signal. Thus, the present invention is able to output a new clock signal which closely tracks the frequency of the master clock signal.

The present invention provides an extremely fast method of changing the frequency of the synthesizer output signal. Each time the microprocessor reads a different value from counter 28, it adjusts N. As discussed, this corrects the output signal to the proper frequency. Thus, the microprocessor 24 can adjust the output signal as often as counter 32 generates an overflow signal. Accordingly, the digital method employed by the present invention is faster than prior art methods utilizing analog technology.

The present invention also provides a means for generating an accurate timing signal if the connection to the master clock is broken. When the master clock signal is lost, the microprocessor 24 will be supplying a particular value of N to the synthesizer 22 such that the $F_{out}$ tracks the most recent value of $F_{master}$. Without the master clock signal, however, counter 32 will not continually increment. This, in turn, will prevent latch 24 from periodically supplying the contents of counter 28 to microprocessor 24. The microprocessor will recognize this condition as a break in the master clock signal connection. The microprocessor 24 then keeps N constant so that the frequency of the output signal stays equal to the most recent value of $F_{master}$. Alternatively, the microprocessor can generate a predetermined value of N so the output signal is set to some chosen value. It will be apparent to those skilled in the art that whichever method is chosen is a matter of design choice.

Accordingly, a direct digital loop for use in digital electronic systems having both slave and master clocks has been described. The present invention is an improvement over prior art devices and permits a slave clock to closely track a master clock signal while providing a highly accurate timing signal in the absence of the master clock. The present invention utilizes a digital process to generate the slave signal, thus eliminating the sources of error that are present in analog clock systems.

In the foregoing Specification, the invention has been described with reference to specific exemplary embodiments. It will be evident, however, that various modifications and changes may be made in these embodiments without departing from the broader spirit and scope of the invention as set forth in the following claims. The Specification and drawings are, accordingly, to be regarded in an illustrative, rather than a restrictive, sense.

What is claimed is:

1. A timing device, comprising:

an oscillator for generating a first signal having a first frequency;

digital synthesizer means coupled to said oscillator for generating a second signal having a second frequency related to said first frequency;

digital phase detection means coupled to said synthesizer means for measuring the change in phase difference between said second signal and a third signal supplied to said digital phase detection means, said digital phase detection means comprising at least one counter coupled to said third signal;

said digital phase detection means varying said second frequency in response to a change in an output signal of said counter, said output of said counter corresponding to said changes in said phase difference between said second and third signals.

2. The device of claim 1 wherein said oscillator operates at a fixed frequency.

3. The device of claim 1 wherein said digital phase detection means comprises first and second counters and a microprocessor, wherein said first counter is coupled to said synthesizer, said second counter is coupled to said third signal, and said microprocessor is coupled to said counters and said synthesizer such that said microprocessor reads a value in each of said counters and provides a fourth signal to said synthesizer according to the values of said counters.

4. The device of claim 3 wherein said microprocessor generates said fourth signal by means of data stored in a look-up table coupled to said microprocessor.

5. The device of claim 4 wherein said look-up table comprises a non-volatile memory.

6. The device of claim 1 wherein said oscillator generates a signal having a frequency approximately equal to 10.24 MHz.

7. A digital locked loop for use as a slave clock in an electronic system having a master clock which generates a master clock signal coupled to at least one slave clock comprising:

an oscillator for generating a first signal having a first frequency;

a digital synthesizer means coupled to said oscillator for accepting a numerical value (N) from a microprocessor coupled to said digital synthesizer means and generating a second signal having a second frequency, said second frequency being a predetermined function of said first frequency and N;

a first counter means coupled to the output of said synthesizer;

a second counter means coupled to said master clock and a latch means, said latch means also being coupled to said first counter means and said microprocessor, said second counter means generating an enabling signal after counting a predetermined number of pulses in said master clock signal;

said latch means storing a value of said first counter upon receiving said enabling signal from said second counter and providing said stored value to said microprocessor, said microprocessor in turn generating a new value of N in response to changes in said stored value such that said frequency of said second signal varies to be substantially equal to a frequency of said master clock signal.

8. The device of claim 7 wherein said oscillator is nonadjustable.

9. The device of claim 7 wherein N is chosen such that said second frequency is substantially equal to said frequency of said master clock signal.

10. The device of claim 7 wherein said microprocessor generates a predetermined value of N in the absence of said master clock signal.

11. The device of claim 7 wherein said microprocessor keeps N fixed at its most recent value in the absence of said signal from said maser clock.

12. The device of claim 7 wherein said first frequency is approximately equal to 10.24 MHz.

13. The device of claim 7 wherein said first and said second counter means both store a same maximum value.

14. The device of claim 13 wherein said predetermined number of pulses is equal to said maximum value.

15. The device of claim 14 wherein said enabling signal is an overflow signal generated by said second counter means after said second counter means has counted a number of pulses in said master clock signal equal to said maximum value.

16. The device of claim 15 wherein said first counter means stores a second maximum value, said second maximum value being equal to said first maximum value.

17. The device of claim 15 wherein said first maximum value is $2^{16}$.

18. The device of claim 7 wherein said predetermined function is defined as follows:

$$F_{out} = \frac{(N)(F_{osc})}{2^X}$$

wherein X is the number of binary digits (bits) used by the synthesizer;

wherein $F_{osc}$ is equal to said first frequency, and $F_{out}$ is equal to said second frequency.

* * * * *